United States Patent [19]

Roveda et al.

[11] Patent Number: 4,614,923
[45] Date of Patent: Sep. 30, 1986

[54] METHOD OF SUPPRESSING MAGNETOSTATIC WAVES IN MAGNETIC GARNET FILMS FOR MICROWAVE CIRCUIT APPLICATIONS

[75] Inventors: Riccardo Roveda, Rome; Carlo Di Gregorio, Grottaferrata; Paolo De Gasperis; Giuseppe Miccoli, both of Rome, all of Italy

[73] Assignees: Selenia Industrie Elettroniche Associate SpA; I.E.S.S. C.N.R., both of Rome, Italy

[21] Appl. No.: 704,073

[22] Filed: Feb. 21, 1985

[30] Foreign Application Priority Data

Feb. 21, 1984 [IT] Italy ................ 47733 A/84

[51] Int. Cl.$^4$ .................. H03H 9/00; H01P 3/00
[52] U.S. Cl. .................. 333/147; 333/24.2; 333/141; 333/245
[58] Field of Search .............. 333/24.2, 147–148, 333/193–196, 150–155, 201, 141–145, 245; 252/62.51, 62.57; 310/26

[56] References Cited

U.S. PATENT DOCUMENTS

| 3,639,247 | 2/1972 | Takamizawa et al. | 252/62.57 |
| 3,845,477 | 10/1974 | LeCraw et al. | 252/62.57 |
| 3,886,077 | 5/1975 | Nicolas et al. | 252/62.57 |
| 3,935,550 | 1/1976 | Adam et al. | 333/148 X |
| 4,316,162 | 2/1982 | Volluet et al. | 333/201 |

Primary Examiner—Marvin L. Nussbaum
Attorney, Agent, or Firm—Karl F. Ross; Herbert Dubno

[57] ABSTRACT

Method for the controlled suppression of magnetostatic waves within magnetic garnet films for microwave circuit applications, based upon the adoption of multilayer structures of epitaxial garnet films of low magnetic losses and high magnetic losses.

12 Claims, 14 Drawing Figures

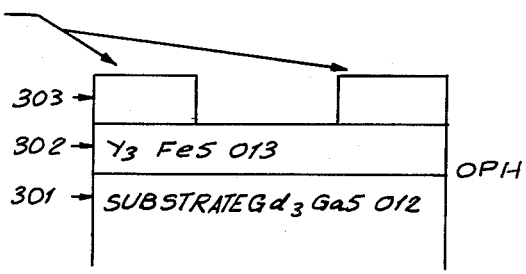
FIG. 5a
FIG. 5b
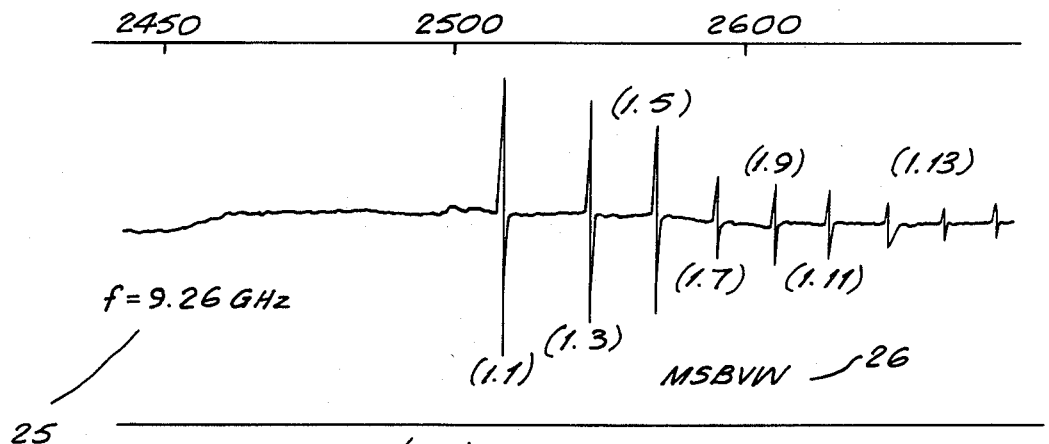
FIG. 5c
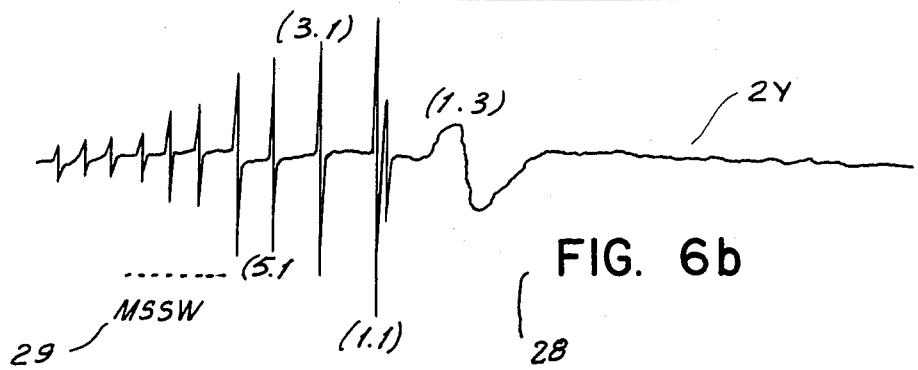
FIG. 6a
FIG. 6b

METHOD OF SUPPRESSING MAGNETOSTATIC WAVES IN MAGNETIC GARNET FILMS FOR MICROWAVE CIRCUIT APPLICATIONS

FIELD OF THE INVENTION

Our present invention relates to a method of partial or total suppression of magnetostatic modes in microwave-propagation devices of the garnet-film type and to garnet-film microwave devices with magnetostatic wave suppression.

BACKGROUND OF THE INVENTION

Microwave devices using garnet-films have widespread application and are, in particular, used in radar systems, electronic warfare, telecommunication satellites, avionics and related instrumentation.

Such systems increasingly require higher operational frequencies and wider bandwidths.

This has been an incentive in the search for new techniques and technologies for signal processing. A relatively new analog technique useable in the microwave field has been developed, based upon magnetostatic wave (MSW) propagation in Yitrium-Iron garnet (YIG) class ferrimagnetic films ($Y_3Fe_5O_{12}$ and cationic replaced derivatives thereof such as LaGa:YIG) having low losses, achieved by liquid phase epitaxy (LPE). MSW are slow electromagnetic waves which propagate at microwave frequencies in magnetically based ferrites.

Their salient parameters are:

Power level: orders of magnitude of $\mu W$ to mW
Frequency range: 0.5 to 20 GHz
Velocity range: 3 to 300 mm/$\mu$sec
High coupling efficient
Propagation losses: as low as 0.02 dB/nsec
Bandwidth: up to 1 GHz
Dynamic interval: +50 dB
Delay times: 1 to 1000 nsec
Magnetic field bias: 0.1 to 10 KOe MSW can be tuned to all microwave frequencies by varying the magnetic bias field ($H_o$). Depending upon the orientation of $H_o$, with respect to the sample plane, it is possible to generate magnetostatic surface modes (MSSW) and/or magnetostatic forward (MSFVW) and magnetostatic backward (MSBVW) volume modes, as will be described below.

Devices using MSSW have cutoff frequencies given by $\gamma(H_o+2\pi M_s)$, (low), and
$\gamma\sqrt{H_o(H_o+4\pi M_s)}$, (high), respectively, where $\gamma$ is the gyromagnetic constant ($\gamma=2.81$ MHz/Oe for YIG) and ambient temperature).

Devices operating in volume modes have respectively the following cutoff frequencies $\gamma\sqrt{H_o(H_o+4\pi M_s)}$ (low) and $\gamma H_o$ (high).

A typical ferrimagnetic resonance (FMR) spectrum (discussed further below) on a square chip (2.3×2.3 $mm^2$) made of YIG, at the fixed frequency of 9.26 GHz, where field $H_o$ is parallel to the film plane has been illustrated in the drawing; in such configuration both MSSW and MSBVW modes are excited simultaneously. For each mode the respective wave numbers ($n_y$, $n_z$) are indicated, related to wave vectors parallel to the film plane by the following:

$K_y = n_y/l_y$
$K_z = n_z/l_z$ where $l_y$, $l_z$ are the chip's lateral dimensions.

As a consequence of the above, by varying the bias field $H_o$, the frequency and the propagation vector K, it is possible to have a complete set of curves characterizing the dispersion of the various magnetostatic modes. The most direct consequence of this fact is the possibility of delaying a microwave signal which has been injected, in an opportune manner, into the epitaxial film by means of microstrip transducers laid directly onto the magnetic film or, better still, onto an alumina substrate which can then be faced with the magnetic film.

Other possible applications, thanks to the low magnetic losses, are in the field of filters, resonators and oscillators.

In some circuit applications (such as filters) it may be necessary to attenuate or to suppress single modes or entire regions of the magnetostatic band.

OBJECTS OF THE INVENTION

The general object of our present invention, therefore, is total suppression of such modes, without increasing insertion losses of magnetostatic microwave devices and assuring a complete rejection of spurious signals, which are undesirable within the bandwidth.

A more specific object is to provide an improved method of suppressing magnetostatic waves in a controlled manner in such devices.

Another object is to provide improved magnetostatic microwave devices for the applications described without the disadvantages of prior art devices.

SUMMARY OF THE INVENTION

These objects are achieved in accordance with the invention, by modifying the magnetostatic spectrum by use of multilayer structures of epitaxial magnetic films which manifest diverse magnetic relaxation characteristics, i.e. by the selective application of such layers.

It is a well known fact (see B. Lax and K. J. Button; Microwave Ferrites and Ferrimagnetics, McGraw-Hill, N.Y. 1962) that the relaxation of the single magnetic ions contained within the crystal lattice, which is due to a number of physical processes, determines the total propagation losses within the sample.

The working principle of the present invention is that of overlaying, by means of further Liquid Phase Epitaxy (LPE) growth, the magnetostatic low loss garnet layer (e.g. YIG, or La,Ga:YIG) with an absorption layer of garnet doped with high magnetic relaxation ions (such as $Fe^{3+}$, $Fe^{2+}$, $Co^{2+}$, $Fe^{4+}$ Rare Earths, etc.).

As a consequence, in an FMR experiment, modes which are related to the magnetostatic layer and which fit that area of the magnetic field which coincides with the loss area related to the absorption layer, are in part attenuated or totally suppressed as illustrated in the drawing and discussed below. From a physical viewpoint, the magnetic losses of this second layer are, for $Fe^{4+}$ or $Fe^{2+}$ ions, in the main due to vortex current relaxation processes (see C. Borghese and P. DeGasperis: On the Nature of the Microwave Spectra and Relaxation in Conductive $Fe^{4+}$ doped Garnet Films; IEEE Trans. MAG-18(6)624(1982)) arising from the presence of such ions which introduce an appreciable conductivity into the garnet ($\sigma \lesssim 10^{-3}$ $\Omega^{-1}$ $cm^{-1}$ against $\sigma \approx 10^{-12}$ $\Omega^{-1}$ $cm^{-1}$ of pure garnet).

As this process is a function of the number of relaxing ions, of frequency, conductivity and chip surface area, as a consequence, the loss region related to the absorption layer can be conveniently tailored by operating upon such parameters.

Relaxing ions enhancement within single or multiple absorption layers may be achieved by making recourse to different dopants during LPE growth.

For total electrical charge compensation $Fe^{4+}$ ions may, for instance, be generated through partial substitution within the garnet by means of bivalent diamagnetic ions such as $Ca^{2+}$ (particularly effective), $Mg^{2+}$, $Be^{2+}$, $Zn^{2+}$, $Sr^{2+}$. In the case of $Fe^{2+}$ ions, on the other hand replacement by tetravalent diamagnetic ions may be exploited, such as $Ge^{4+}$, $Si^{4+}$, $Th^{4+}$, $Hg^{4+}$, $Zr^{4+}$, $Ti^{4+}$, $Sn^{4+}$ or pentavalent ions such as $V^{5+}$, $Nb^{5+}$, $Ta^{5+}$ or monovalent ions such as $Li^{+}$.

Noticeable dissipating effects may also be obtained by direct use of relaxing ions such as $Co^{2+}$ and Rare Earths ($Er^{3+}$, $Ho^{3+}$, $Dy^{3+}$, etc; but not $La^{3+}$ and $Lu^{3+}$).

BRIEF DESCRIPTION OF THE DRAWING

The above and other objects, features and advantages of our invention will become apparent from the following description with reference to the accompanying highly diagrammatic drawing in which:

FIGS. 5a, 5b and 5c are diagrammatic sections of structures which may be used for magnetostatic mode suppression;

FIG. 6a is a graph which illustrates modifications of an FMR spectrum with surface mode suppression; and FIG. 6b is a graph which illustrates modifications of an FMR spectrum with volume mode suppression.

SPECIFIC DESCRIPTION

Figure 1C:
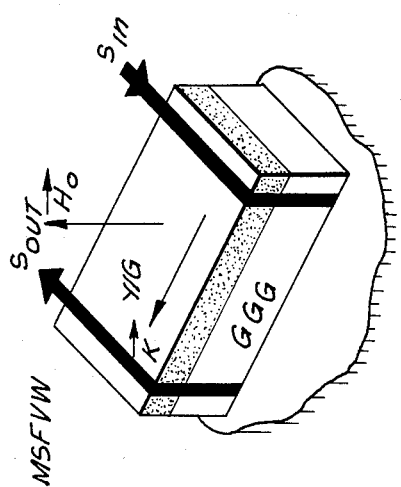
FIGS. 1a, 1b and 1c are diagrammatic perspective views illustrating magnetostatic principles applicable to the invention.
Figure 1B:
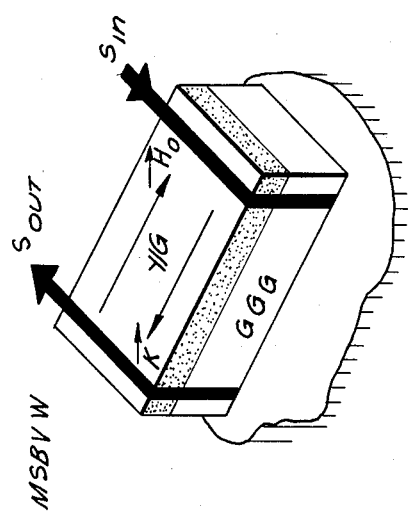
Figure 1A:
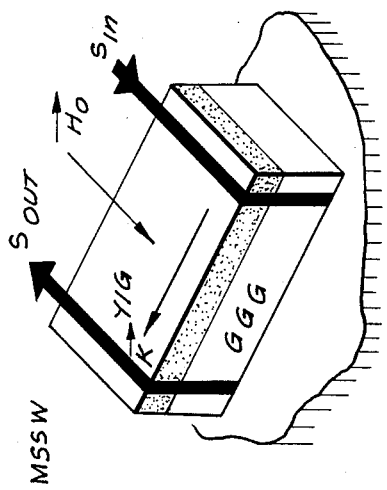

FIGS. 1a–1c illustrate magnetostatic wave devices outline principles. GGG indicates the gadolinium and gallium garnet substrate ($Gd_3Ga_5O_{12}$) over which the yttrium and iron garnet (YIG) magnetostatic film is grown by Liquid Phase Epitaxy. The three orientations of the static bias magnetic field. $H_o$ are shown with respect to the wave vectors K, which give way, in presence of YIG film excitation by r.f. (radiofrequency), to surface magnetostatic waves (MSSW) FIG. 1a, backward volume waves (MSBVW) FIG. 1b or forward volume waves (MSFVW) FIG. 1c in respective modes.

Figures 2, 2A:
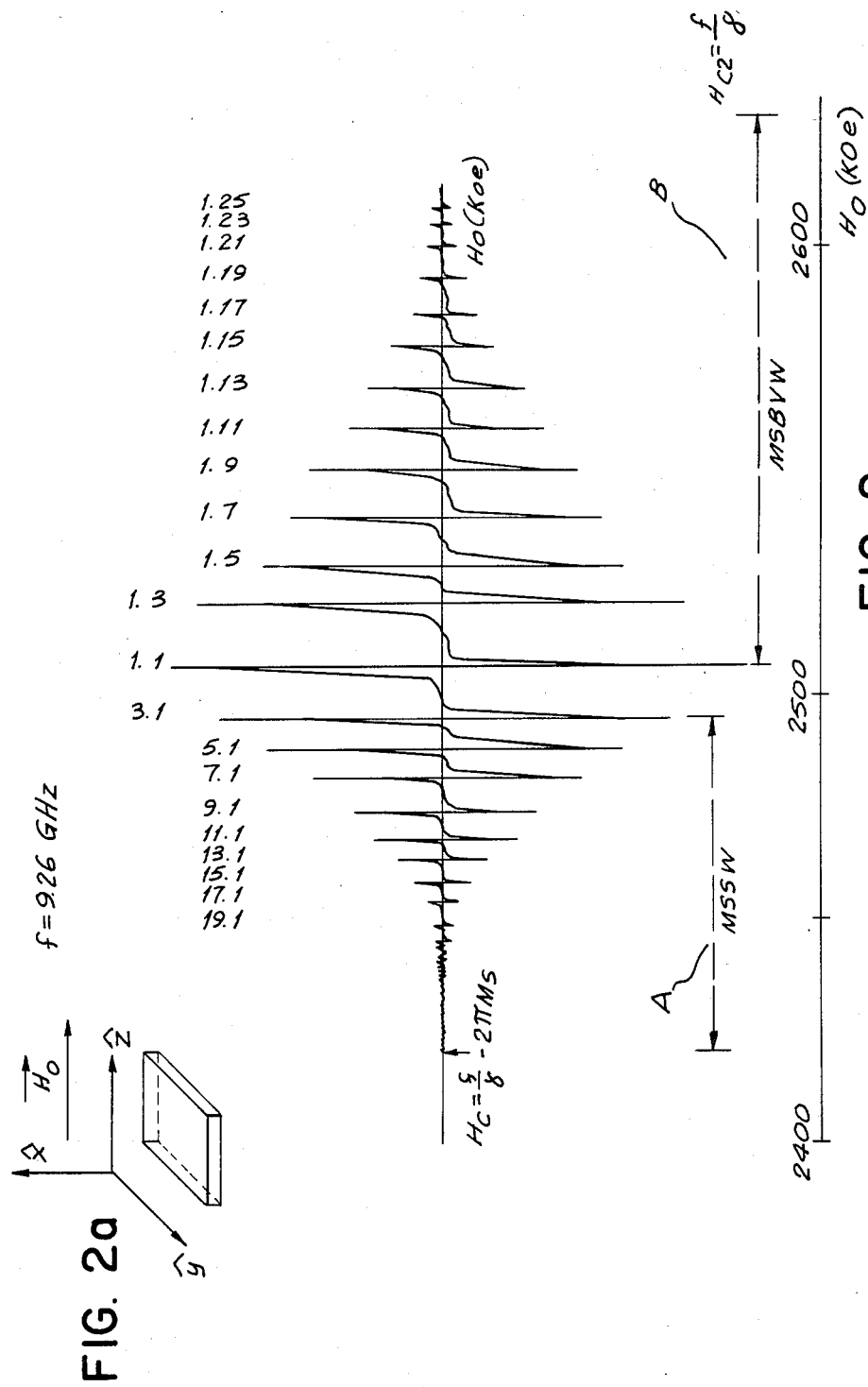
FIG. 2 is a graph which illustrates typical ferrimagnetic resonance spectra FMR, obtained on a YIG chip.
FIG. 2a is a diagram illustrating vector directions applicable to FIG. 2.

FIG. 2 illustrates a typical ferrimagnetic resonance spectrum FMR, obtained on a YIG chip (2.3×2.3 mm$^2$) at 9.26 GHz with field $H_o$ parallel to the film plane. A indicates surface modes MSSW, and B indicates the volume modes MSBVW. The parallel wave numbers ($n_y$,$n_z$) are indicated next to each mode. The response is the first derivative of the absorption signal.

Figure 3:
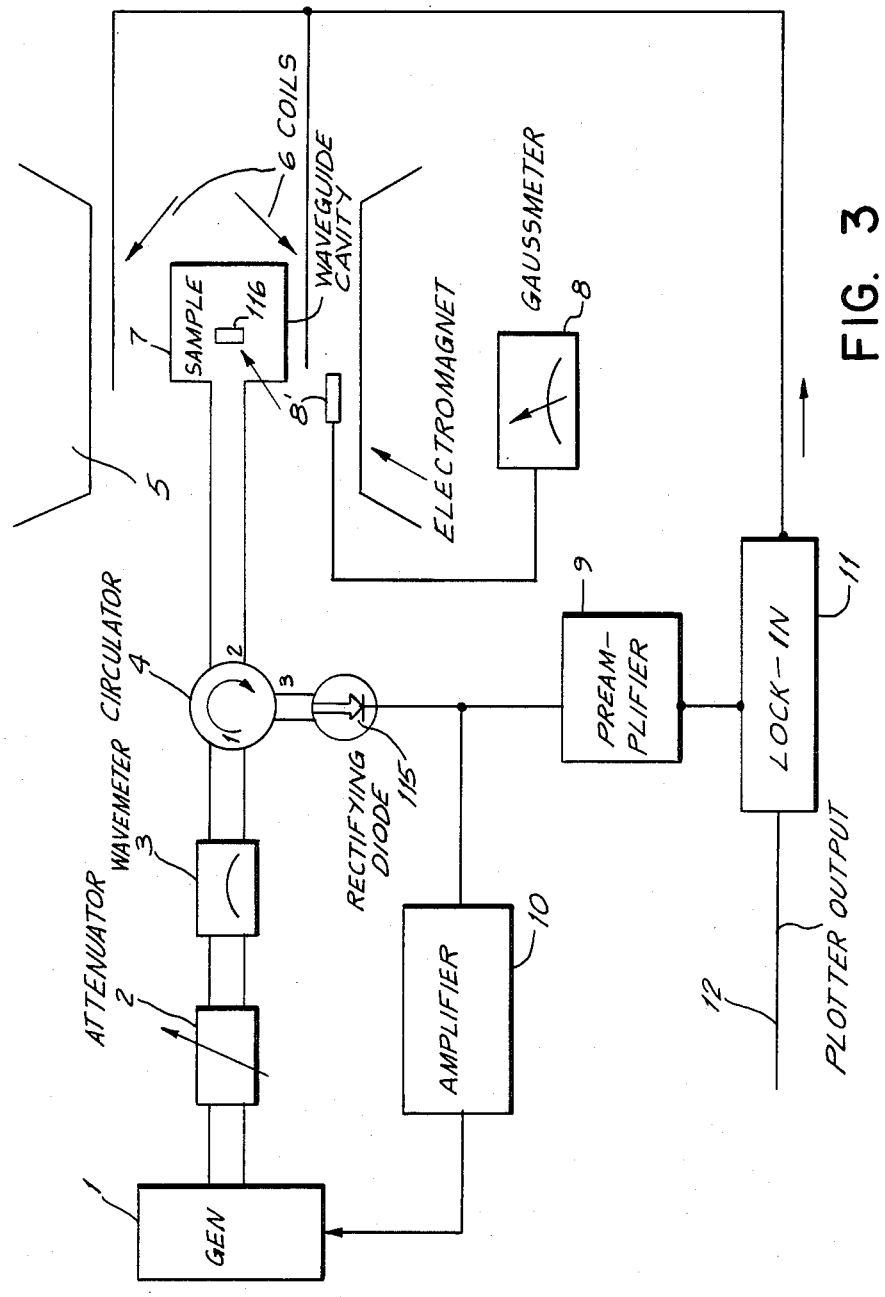
FIG. 3 is a block diagram which illustrates a typical experimental set-up for ferrimagnetic resonance FMR, measurement.

FIG. 3 illustrates a typical experimental set-up for ferrimagnetic resonance (FMR) measurement. As can be seen from the drawing, it includes a generator 1, an attenuator 2, a wavemeter 3, a circulator 4, a rectifying diode 115 and a waveguide cavity 7 which contains the sample 116 under examination. The set-up also includes the electronic controls and amplifiers 10, the preamplifiers 9, lock-in 11 and plotter output 12.

The magnetic field generated by electromagnet 5, modulated by coils 6, is measured by the gaussmeter 8 via the magnetic field probe 8'.

Figure 4A:
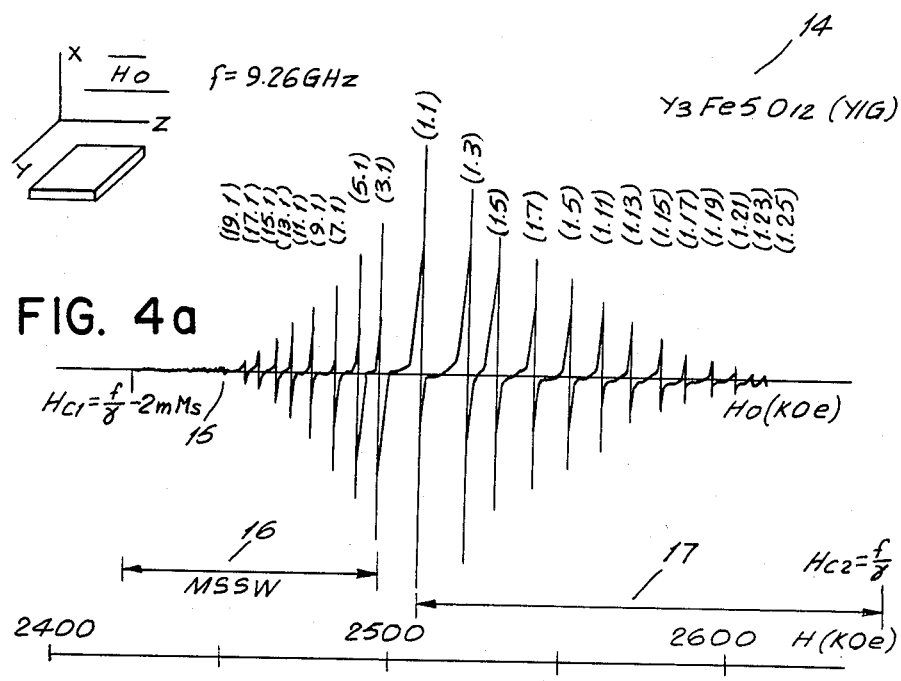
FIG. 4a is a graph which illustrates the FMR spectrum of bare YIG film.

FIG. 4a illustrates a typical FMR spectrum obtained on a bare YIG ($Y_3Fe_5O_{12}$) film at 9.26 GHz as shown in FIG. 2. The sensitivity scale is X1. The surface modes (MSSW) are indicated by 16 and the volume modes (MSBVW) are indicated by 17.

Figure 4B:
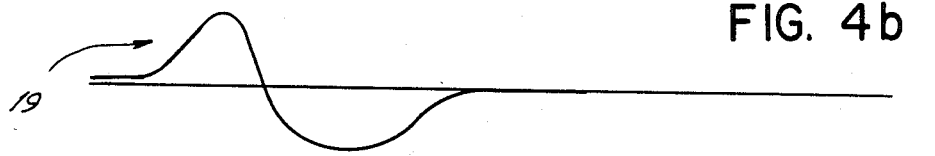
FIG. 4b is a graph which illustrates the FMR spectrum of a bare absorption layer.

FIG. 4b illustrates a typical FMR spectrum of a bare absorption layer.

Figure 4C:
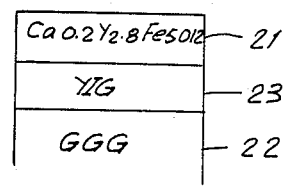
FIG. 4c is a graph which illustrates the FMR spectrum of a composite structure consisting of a single absorption layer grown over a YIG film.
Figure 4C:
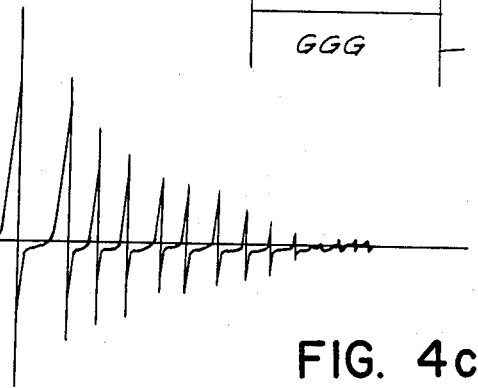

FIG. 4c illustrates the FMR spectrum of a composite structure consisting of a single absorption layer 21 ($Ca_{0.2}Y_{2.8}Fe_5O_{12}$) grown over YIG film 23, on a nonmagnetic substrate 22 (GGC).

FIGS. 5a–5c show examples of structure which may be used for magnetostatic mode suppression.

FIG. 5a illustrates a two layer structure in which 101 indicates the passive dielectric substrate (generally constituted by GGG), which is needed for the LPE growth; 102 and 103 indicate respectively the magnetostatic layer (YIG or La,Ga:YIG) and the absorption layer (Ca Y)$_3$Fe$_5$O$_{12}$ or (Ca Y)$_3$(Ga Fe)$_5$O$_{12}$.

FIG. 5b illustrates a multilayer substrate in which 201 indicates the passive dielectric substrate, 203 is the magnetostatic layer and 202 and 204 are the absorption layers.

FIG. 5c illustrates a schematic of the implementation of a dissipative termination for the attenuation or the suppression of disturbance magnetostatic modes, related to reflections form peripheral areas of the low loss garnet films, used for the implementation of microwave signal processing devices, such as delay lines, resonators, oscillators and filters.

FIGS. 6a and 6b illustrate typical modifications of an FMR spectrum (such as that of FIG. 2) due to two different calcium concentrations within layer 103 in FIG. 5a, with surface (6a) and volume (6b) mode suppression.

FIG. 6a illustrates surface mode suppression obtained in parallel configuration at 9.26 GHz on a 0.28×0.20 cm$^2$ sample 25. Volume modes (right hand side of the figure) are unaffected.

FIG. 6b shows volume mode suppression obtained in the same conditions as above on a sample 28 of dimension 0.22×0.21 cm$^2$ surface modes (left hand side of the figure) are unaffected. Depending upon the quantity of calcium within layer 3 of FIG. 5a, different types of response may be expected, such as those depicted in FIGS. 6a and 6b, i.e. controlled suppression of magnetostatic mode bands. A more complex structure such as, for example, the one in FIG. 5b without limitations of layers and compositions, implements a low pass filtering function of magnetostatic modes, with the possibility of selecting down to one single preselected mode.

FIG. 5c shows the implementation of a loss termination for the attenuation or the suppression of disturbance magnetostatic modes which are due to peripheral reflections within low loss garnet films used for the implementation of microwave signal processing devices, such as delay lines, resonators, oscillators, filters. The present invention affords a selectivity in the order of a few tens of MHz; furthermore its planar configuration gives way to an ease of integration within more complex structures, such as delay lines, resonators, oscillators, etc.

We claim:

1. A method for the controlled suppression of magnetostatic waves in garnet films for microwave applications comprising:

applying to a passive dielectric substrate at least one epitaxial layer of a low magnetic loss Yttrium-Iron-Garnet film; and applying to said low loss Yttrium-Iron Garnet film at least one epitaxial layer of a high magnetic loss Calcium-Yttrium-Iron Garnet film.

2. The method as defined in claim 1 wherein said high magnetic loss garnet film is treated with a relaxation ion selected from the group consisting of $Fe^{2+}$ and $Fe^{4+}$.

3. The method as defined in claim 2, further comprising the step of effecting total charge compensation of said relaxation ions in said high loss garnet film by partially substituting within garnet of said high loss film an ion selected from the group consisting of monovalent diamagnetic ions $Li^+$, bivalent diamagnetic ions $Ca^{2+}$, $Mg^{2+}$, $Be^{2+}$, $Zn^{2+}$ and $Sr^{2+}$, tetravalent diamagnetic ions $Ge^{4+}$, $Si^{4+}$, $Th^{4+}$, $Hf^{4+}$, $Ti^{4+}$ and $Sm^{4+}$, and pentavalent diamagnetic ions $V^{5+}$, $Nb^{5+}$ and $Ta^{5+}$.

4. The method as defined in claim 1 wherein said high magnetic loss garnet film is treated with a relaxation ion selected from the group consisting of $Co^{2+}$, $Er^{3+}$, $Ho^{3+}$ and $Oy^{3+}$.

5. The method as defined in claim 1 wherein said high loss garnet film is $(Ca\ Y)_3Fe_5O_{12}$ and said low loss garnet film is $Y_3Fe_5O_{12}$.

6. The method as defined in claim 5, further comprising a second high loss garnet film, wherein said second high loss garnet film is $(Ca\ Y)_3Fe_5O_{12}$.

7. A microwave signal processing device for the controlled suppression of magnetostatic waves in magnetic garnet films consisting of, in contacting relationship:

a passive dielectric substrate;

at least one epitaxial layer of low loss Yttrium-Iron Garnet film; and at least one epitaxial layer of high magnetic loss Calcium-Yttrium-Iron Garnet film.

8. A device as defined in claim 7 wherein said low loss garnet film is $Y_3Fe_5O_{12}$ and said high loss garnet film is $(Ca\ Y)_3Fe_5O_{12}$.

9. A device as defined in claim 8, further comprising a second high loss garnet film, wherein said second high loss garnet film is $(Ca\ Y)_3Fe_5O_{12}$.

10. A device as defined in claim 7 wherein said epitaxial layer of said high magnetic loss garnet film forms a channel on said low loss garnet film.

11. The device as defined in claim 7 wherein said high magnetic loss garnet film includes a relaxation ion selected from the group consisting of $Fe^{2+}$, $Fe^{3+}$ and $Fe^{4+}$.

12. The device as defined in claim 7 wherein said high magnetic loss garnet film includes a relaxation ion selected from the group consisting of $Co^{2+}$, $Er^{3+}$, $Ho^{3+}$ and $Dy^{3+}$.

* * * * *